(12) United States Patent
Lin et al.

(10) Patent No.: US 7,566,525 B2
(45) Date of Patent: Jul. 28, 2009

(54) METHOD FOR FORMING AN ANTI-ETCHING SHIELDING LAYER OF RESIST PATTERNS IN SEMICONDUCTOR FABRICATION

(75) Inventors: Chin-Hsiang Lin, Hsin-chu (TW); Ching-Yu Chang, I-Lan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 722 days.

(21) Appl. No.: 11/152,559

(22) Filed: Jun. 14, 2005

(65) Prior Publication Data

US 2006/0281030 A1    Dec. 14, 2006

(51) Int. Cl.
*G03F 1/00* (2006.01)
*H01L 21/00* (2006.01)
(52) U.S. Cl. .............. 430/313; 430/272.1; 430/311; 430/322; 430/323; 430/328
(58) Field of Classification Search .............. 430/311, 430/312, 313, 328, 330, 271.1, 323
See application file for complete search history.

(56) References Cited

U.S. PATENT DOCUMENTS

| 5,194,364 A * | 3/1993 | Abe et al. ............... 430/325 |
| 2004/0009436 A1* | 1/2004 | Lee et al. ............... 430/313 |

* cited by examiner

*Primary Examiner*—Thorl Chea
(74) *Attorney, Agent, or Firm*—K & L Gates LLP

(57) ABSTRACT

A method is disclosed for forming a photoresist pattern with enhanced etch resistance on a semiconductor substrate. A photoresist pattern is first formed on the substrate. A silicon-containing polymer layer is deposited over the photoresist pattern on the substrate. A thermal treatment is performed to form a cross-linked anti-etch shielding layer between the photoresist pattern and the silicon-containing layer. Then, the remaining silicon containing layer is removed. A plasma treatment is performed in order to increase an etch resistance of the cross-linked anti-etch shielding layer and the photoresist pattern.

9 Claims, 2 Drawing Sheets

METHOD FOR FORMING AN ANTI-ETCHING SHIELDING LAYER OF RESIST PATTERNS IN SEMICONDUCTOR FABRICATION

BACKGROUND

The present invention relates generally to semiconductor devices, and more particularly, to the creation of fine granularity etch resistant (hard) masks for efficient sub-micron semiconductor devices fabrication.

As semiconductor devices develop into the sub-micron region and are more highly integrated, interconnections and isolation widths required in the manufacturing processes have become very fine. In general, a fine pattern is formed through a process including forming a resist pattern by a photolithographic technique, and etching various underlying thin films through the resist pattern. The photolithographic technique includes resist coating, mask alignment, exposure to light, and development. This technique has a limit due to the natural limitation of the wavelength of the exposing light. In other words, when using the conventional photolithographic technique, it is difficult to form a critical dimension of a fine resist pattern that exceeds the limit of the wavelength of the exposing light.

Furthermore, the conventional lithographic technique has difficulty in controlling the etching resistance of a resist pattern, making it impossible to fully control a surface profile. As such, the etched pattern on a substrate is relatively rough, especially on the surfaces of the side walls of the etched patterns. As semiconductor fabrication processes delve into the sub-micron level, it is increasingly difficult to obtain fine granularity dimensions with the photolithography technique. In addition, the resist pattern formed by conventional methods is further affected by the use of SEM E beam testing. The SEM E beam test is used for verification of the semiconductor dimensions, but causes shrinkage of the critical dimensions.

Desirable in the art of sub-micron semiconductor device fabrication are new fabrication methods that effectively create fine granularity semiconductor dimensions and provide additional control of the etch resistance to the resist pattern layer.

SUMMARY

In view of the foregoing, a method is disclosed for forming a photoresist pattern with enhanced etch resistance on a semiconductor substrate. A photoresist pattern is first formed on the substrate. A silicon-containing polymer layer is deposited over the photoresist pattern on the substrate. A thermal treatment is performed to form a cross-linked anti-etch shielding layer between the photoresist pattern and the silicon-containing layer. Then, the remaining silicon containing layer is removed. A plasma treatment is performed in order to increase an etch resistance of the cross-linked anti-etch shielding layer and the photoresist pattern.

The construction and method of operation of the invention, however, together with additional objects and advantages thereof will be best understood from the following description of specific embodiments when read in connection with the accompanying drawings.

DESCRIPTION

This invention discloses a method for forming a hard mask with fine patterns on a semiconductor substrate. This invention utilizes a silicon-based water-soluble polymer material in place of a conventional resist layer to create the fine resist pattern mask. The method also incorporates a radiation treatment to make the resist pattern of the hard mask more etch resistant, thereby providing additional protection to the semiconductor structures during an etching process.

Figure 1:
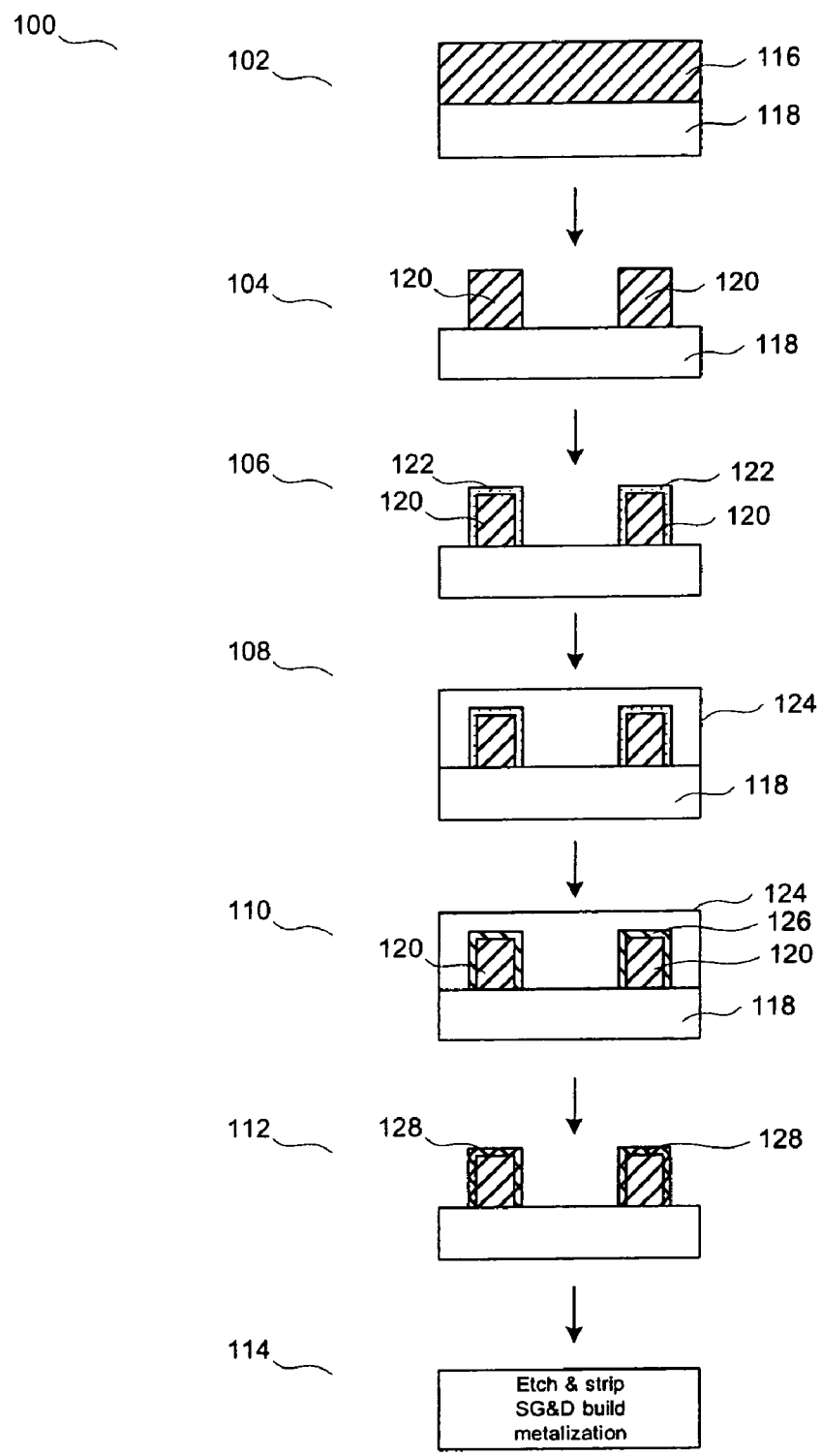
FIG. 1 illustrates a process for forming a photoresist layer, according to a conventional semiconductor fabrication method.

FIG. 1 illustrates a conventional process 100 for semiconductor fabrication. The conventional method utilizes the photolithographic technique, which includes a step of exposure to light, to form a resist pattern. With this method, it has been difficult to form a fine resist pattern layer that exceeds the limit of the wavelength of the exposing light. The fabrication steps 102 through 114 encompass the semiconductor fabrication process from the application of the first resist layer to the completion of the semiconductor fabrication process.

Step 102 forms a first photoresist layer 116 on an ultra-pure substrate 118 on a semiconductor wafer by a predetermined process, such as spinning-on coating. The first photoresist layer 116 is made of such materials that is capable of generating acid substance when activated by a thermal treatment.

Step 104 creates a first resist pattern 120 on the substrate 118 by exposing the first photoresist layer 116 to a radiation such as a particular light through a predefined mask. The exposing light may be a gray, deep UV light, KrF excimer laser beam, ArF excimer laser beam, electron beam, X-ray, etc., any of which has a wavelength corresponding to a sensitizing wavelength of the first photoresist layer.

Step 106 shows a plurality of acid bands 122 remaining around the first photoresist pattern 120 after the first photoresist layer 116 has been partially removed. The density of this acid band is very high which will contribute to a thick cross-linking layer as will be explained in the step 110. After the formation of the acid bands 122, a post-developing baking may be implemented (e.g., 60 to 120 degrees Celsius for 60 sec). This thermal treatment affects a subsequent mixing reaction (step 110) and should be preferably set at an appropriate temperature corresponding to the material type of first resist pattern 120.

Step 108 shows the forming of a second photoresist layer 124 onto the semiconductor substrate 118. The second photoresist layer 124 is composed of a cross-linkable material capable of cross-linking in the presence of acid. It can be dissolved in a solvent that is incapable of dissolving the first resist acid. The second photoresist layer 124 may be applied by a process, such as spray coating, spin coating, or dipping.

Step 110 thermally treats (e.g., mixing bake) the first photoresist pattern 120 and second photoresist layer 124 on the substrate 118 at about 85 to 150 degrees Celsius for about 60 to 120 seconds. The thermal treatment causes the acid to diffuse from the first photoresist pattern 120 into the second photoresist layer 124, thereby forming a cross-linked layer 126 therebetween. It is understood that the cross-linked layer 126 where the reaction has occurred is formed in the second photoresist layer 124 and covers the first photoresist pattern 120. It is also noted that the second photoresist layer 124 remains unaffected by the acid reaction and therefore is a non cross-linked area that will be removed in step 112.

Step 112 uses a liquid developer, such as water or an alkaline aqueous solution (such as TMAH), to develop and remove the second photoresist layer 124. The cross-linked area 126 is unaffected by this liquid developer, and essentially becomes the combined cross-linked area 128.

Step 114 contains the remainder of the conventional semiconductor fabrication process steps necessary to complete a semiconductor device. These final steps include the conventional etching of the layers to remove where there is no resist pattern. This is accomplished by either wet or dry etching. A strip process is utilized to remove all photoresist material. The final build of the source, drain, and gate structures is accomplished and the electrical interconnects are incorporated by a metallization process.

In a conventional photolithographic technique, a typical resist layer used under a sub-193 nm radiation has poor etch resistance. One conventional method to increase the etch resistance of the resist pattern is to increase the thickness. However, this results in a decrease of effective depth of focus (DOF), a decrease in the process windows, a decrease in the critical dimension (CD) or CD uniformity, and a decrease in the yield stability. For example, the 0.3 um DOF window is hard to achieve for 65 nm products with a photoresist thickness of 2,000 Angstroms. For a 193 nm resist layer, the line end shortening after etch inspection (AEI) is worse than that of the 248 nm resist layer. Furthermore, the end to end, line end, or line to end dimension variation is difficult to correct by an optical proximity correction (OPC) methods since the space between these patterns is not adequate for OPC correction. A strong optical proximity correction is required for the pattern correction; however, this may increase the complexity of the process. In addition, a better etch resistance enhancement process is needed to correct this problem. But the small fence pattern between two adjacent contact holes or trenches is hard to achieve by the conventional methods. After an etch inspection, the fence would peel, collapse, or be consumed during the etch process. Since a small hole or trench can only be achieved by smaller wavelength equipment, if the desired fine resolution cannot be achieved by the existing equipment, a new smaller wavelength machine is required, which adds to the process equipment cost.

Figure 2:
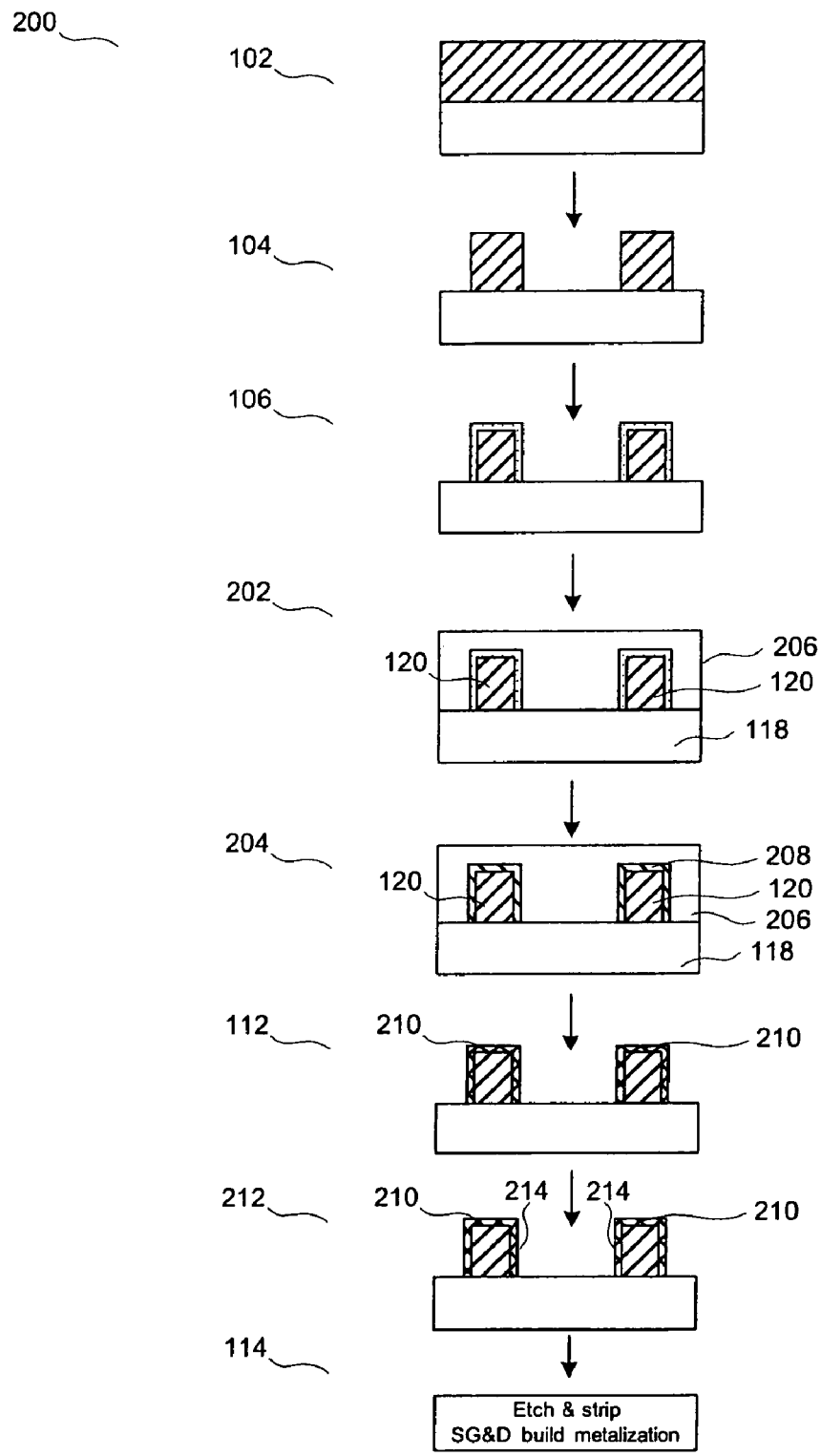
FIG. 2 illustrates a process for forming a fine hard mask for semiconductor fabrication, in accordance with one embodiment of the present invention.

FIG. 2 presents a process 200 for forming an anti-etching shield layer in the resist patterns in accordance with one embodiment of the present invention. With reference to both FIGS. 1 and 2, the steps 102 through 106 are identical to the conventional steps as explained in FIG. 1. It is understood that acid atoms such as H+ are contained in the resist pattern.

Steps 202 and 204 replace steps 108 and 110 by utilizing a water-soluble silicon-based or silicon-containing polymer layer 206 in place of the second photoresist layer 124. The new process steps generate a resist pattern with an overall enhanced etch resistance that can be used to create fine granularity features needed for sub-micron semiconductor devices.

In step 202, the water soluble silicon-based polymer layer 206 is applied over the silicon substrate 118 and the first photoresist layer 120. This water-soluble silicon-based polymer layer 206 may contain materials such as Si, Ti, Ta, Fluoride, Chloride, and double-bond or triple-bond materials including benzyl or phenyl group polymers. It is understood that double bond polymers contain the double bond between two carbon atoms or a carbon and an oxygen atom, these bonds increases the etch resistance. Some of these elements can be introduced to the photoresist layer 120 prior to the deposition of the water soluble silicon-based polymer layer 206. For example, Si, Ti, or Ta molecules can be doped into the photoresist by implant methods.

In step 204, the first photoresist pattern 120 and the water soluble silicon-based polymer layer 206 on the substrate 118 are thermally treated at about 85 to 150 degrees Celsius. The thermal treatment causes the acid atoms to diffuse from the first photoresist pattern 120 into the water-soluble silicon-based polymer layer 206, which forms a second layer of polymer or a cross-linked anti-etching shielding layer 208 therebetween. The cross-linked anti-etching shielding layer 208 where the reaction has occurred is formed in the water soluble silicon-based polymer layer 206, and covers the first photoresist pattern 120. The anti-etching shielding layer is typically about 10 angstroms in thickness. It is understood that a large portion of the water-soluble silicon-based polymer layer 206 that is not cross-linked remains unaffected by the acid reaction and will be removed in the step 112 by a liquid developer.

Step 112 is the conventional process step 112 as explained in FIG. 1. In this step, a liquid developer is applied to remove the non cross-linked layer of the water-soluble silicon-based polymer layer 206, but does not affect the cross-linked layer 208. At this point, the first photoresist pattern 120 and the cross-linked layer 208 are formed together to create a combined resist pattern 210.

Step 212 may applies a new energy treatment such as a plasma treatment to the combined resist pattern 210 to increase the resist pattern etch resistance in subsequent etching steps. The plasma treatment utilizes $O_2$, Ar, $N_2$, or $H_2$ gas plasma for treating the targeted resist pattern. The plasma treatment enhances the etch resistance of the resist pattern for future etching process. Thus, various types of openings such as the side wall 214 in this case will maintain their critical dimension after the etch process and the SEM E beam measurement.

The increased etch resistance due to the plasma treatment provide a number of advantages. The CDU and process window are increased, thereby allowing the method to be less process dependent. The trench or hole CD is decreased allowing for finer granularity features necessary for smaller nm semiconductor geometries. The ADI-AEI CD bias is reduced. With the higher etch resistance due to the plasma treatment, the CD shrinkage due to the SEM E beam testing will be reduced. Finally, since the plasma treatment allows for increased depth of focus (DOF), the required resolution for photolithography of geometries are increased or in other words, less stringent.

Step 114 contains the remainder of the conventional semiconductor fabrication process steps necessary to complete a semiconductor device. These final steps include the conventional etching of the layers to remove the oxide coating where there is no resist pattern. This is accomplished by either wet or dry etching. A strip process is utilized to remove all photoresist material. The final build of the source, drain, and gate structures is accomplished and the electrical interconnects are incorporated by a metallization process.

The present invention discloses a new fine granularity semiconductor fabrication process that increases (hardens) the resist pattern mask. The invention allows the use of water-soluble silicon-based polymer materials on a substrate to provide fine granularity.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for forming a photoresist pattern with enhanced etch resistance on a semiconductor substrate, the method comprising:
   forming a photoresist layer over the substrate;
   doping the photoresist layer by Si, Ti or Ta molecules, wherein the doping comprises implanting the Si, Ti, or Ta molecules into the photoresist layer;
   forming at least one photoresist pattern by selectively exposing the photoresist layer to a light source;
   depositing a water-soluble silicon-containing polymer layer on the photoresist pattern over the substrate;
   thermally treating the photoresist pattern and the water-soluble silicon-containing polymer layer to form a cross-linked anti-etch shielding layer between the photoresist pattern and the water-soluble silicon-containing polymer layer;
   removing the water-soluble silicon-containing polymer layer; and
   performing a plasma treatment on the cross-linked anti-etch shielding layer and the photoresist pattern for enhancing an etch resistance thereof.

2. The method of claim 1 wherein the doping comprises implanting F or Cl molecules into the photoresist layer.

3. The method of claim 1 wherein the plasma treatment is performed in an $O_2$, Ar, $N_2$, or $H_2$ gas ambient.

4. The method of claim 1 wherein the water-soluble silicon-containing polymer material includes double-bond or triple-bond polymers.

5. The method of claim 4 wherein the double-bond or triple-bond polymers farther include benzyl or phenyl polymers.

6. The method of claim 1 wherein the water-soluble silicon-containing polymer layer includes Ti, Ta, F or Cl molecules.

7. The method of claim 1 wherein the thermally treating is performed at a temperature ranged from about 85 to 150 degrees Celsius.

8. A method for forming a photoresist pattern with enhanced etch resistance on a semiconductor substrate, the method comprising:
   forming a photoresist layer over the substrate;
   doping the photoresist layer by Si, Ti, Ta, F, or Cl molecules, wherein the doping comprises implanting the Si, Ti, Ta, F or Cl molecules into the photoresist layer;
   forming at least one photoresist pattern on the substrate;
   depositing a water-soluble silicon-containing polymer layer on the photoresist pattern over the substrate;
   thermally treating the photoresist pattern and the water-soluble silicon-containing polymer layer to induce an acid diffusion from the photoresist pattern to form a cross-linked anti-etch shielding layer between the photoresist pattern and the water-soluble silicon-containing polymer layer;
   removing the water-soluble silicon-containing polymer layer; and
   performing a plasma treatment on the cross-linked anti-etch shielding layer and the photoresist pattern for enhancing the etch resistance of the cross-linked layer and the photoresist pattern.

9. The method of claim 8 wherein the plasma treatment is performed in an $O_2$, Ar, $N_2$, or $H_2$ gas ambient.

* * * * *